United States Patent
Frob et al.

(10) Patent No.: US 8,082,877 B2
(45) Date of Patent: Dec. 27, 2011

(54) HEATING DEVICE COATING PLANT AND METHOD FOR EVAPORATION OR SUBLIMATION OF COATING MATERIALS

(75) Inventors: Hartmut Frob, Reinhardtsgrimma (DE); Jens Drechsel, Reinhardtsgrimma (DE)

(73) Assignee: CreaPhys GmbH (DE)

( * ) Notice: Subject to any disclaimer, the term of this patent is extended or adjusted under 35 U.S.C. 154(b) by 415 days.

(21) Appl. No.: 11/909,180

(22) PCT Filed: Mar. 22, 2006

(86) PCT No.: PCT/EP2006/002632
§ 371 (c)(1),
(2), (4) Date: Nov. 20, 2007

(87) PCT Pub. No.: WO2006/100058
PCT Pub. Date: Sep. 28, 2006

(65) Prior Publication Data
US 2008/0193644 A1 Aug. 14, 2008

(30) Foreign Application Priority Data
Mar. 24, 2005 (DE) .......................... 10 2005 013 875

(51) Int. Cl.
C23C 16/448 (2006.01)
C23C 16/44 (2006.01)

(52) U.S. Cl. .................. 118/723 VE; 118/726

(58) Field of Classification Search ............ 118/723 VE, 118/726
See application file for complete search history.

(56) References Cited

U.S. PATENT DOCUMENTS

| | | | |
|---|---|---|---|
| 3,751,310 A * | 8/1973 | Cho | ................... 117/105 |
| 5,222,074 A * | 6/1993 | Uchiyama et al. | ............... 373/10 |
| 2004/0115338 A1 | 6/2004 | Yoneda | |

FOREIGN PATENT DOCUMENTS

| | | |
|---|---|---|
| CN | 1500904 | 6/2004 |
| DE | 231 584 A1 | 12/1984 |
| DE | 250 552 A1 | 6/1986 |
| DE | AT 002 793 U1 | 11/1998 |
| EP | 0561016 | 9/1993 |
| EP | 1 132 493 A2 | 9/2001 |
| EP | 1167566 | 1/2002 |
| EP | 1418250 | 5/2004 |
| EP | 1 418 250 A2 * | 12/2004 |
| GB | 2 263 501 A | 7/1993 |
| JP | 58136773 | 8/1983 |
| TW | 534926 | 6/2003 |
| TW | 200410584 | 11/2006 |

* cited by examiner

Primary Examiner — Rudy Zervigon
(74) Attorney, Agent, or Firm — DLA Piper LLP (US)

(57) ABSTRACT

A heating device is provided wherein coating material can be transferred into the gas phase, particularly for use in a coating installation. The heating device preferably includes at least one heating unit with hollow spaces and an inner surface, wherein the hollow spaces of the heating unit are loadable with a coating material, and with a plurality of heating elements located in a distributed arrangement in the volume of the heating unit. A coating installation and a method for the transfer of coating material into the gas phase are also described.

21 Claims, 2 Drawing Sheets

HEATING DEVICE COATING PLANT AND METHOD FOR EVAPORATION OR SUBLIMATION OF COATING MATERIALS

TECHNICAL FIELD

The invention relates to a heating device with which material can be transferred into the gas phase by means of evaporation or sublimation, for example for use in a coating installation and in particular a heating device for an evaporator. The invention further relates to a coating installation which is equipped with at least one such heating device, and a method for the evaporation and sublimation of materials, particularly for coating purposes.

BACKGROUND

The coating by means of thermal evaporation has been generally known for the past decades. The simplicity of the thermal evaporation is an essential reason for its extensive propagation in the field of coating methods, particularly in the manufacture of organic opto-electronic systems such as, for example, displays on the basis of organic light-emitting diodes (OLED).

During the thermal evaporation the material to be evaporated is heated in an evaporator in such a way that it changes over into the gaseous condition (evaporation or sublimation). After this, the material particles (molecules, among others) migrate to the envisaged deposition surface, as a result of their obtained kinetic energy or by means of diffusion processes (e.g. in a carrier gas) where they then condense. In a typical manner, the evaporation takes place under vacuum conditions. However, evaporations under reduced pressure or even at atmospheric pressure by means of inert carrier gas are also possible.

From practice, numerous techniques for the transfer of the material into the gas phase are known. In an uncomplicated form, the material to be evaporated is put into a crucible which is surrounded by a heating element (a filament). When the crucible is heated, the material is heated up either by heat radiation and/or heat conductivity and, in this way, the energy as required up to the transition into the gas phase is applied.

Evaporators for the coating technique are frequently designed in such a way that as much material as possible is deposited within the shortest possible time but, however, under stable conditions. In this case, the material should only be thermally stressed to a minor degree with the setting of an evaporator temperature as low as possible. This requirement is relevant particularly for organic materials because these tend towards transformation or destruction with an excessively high energy input. Then again, the stability of the material must also be observed with inorganic compounds.

In order to comply with the above-mentioned requirements, it was proposed to have a homogenous energy input into the material to be evaporated. In EP 1 132 493 A2 it is proposed for the evaporation of organic molecules for the coating of substrates to mix the evaporating material in a crucible with particles of metal or ceramic material which have a high level of thermal conductivity. Despite the improved thermal conductivity reaction with the addition of the metal or ceramic particles, there is the disadvantage that the energy input into the crucible is effected only indirectly. The energy transport through the particles is only inadequate as it is reduced at the contact points between the particles by the material to be evaporated. There can be a further disadvantage in the fact that, as a result of the loose arrangement in the crucible, the radiating characteristics of the evaporator change with a varied filling level. This has negative influences on the coating homogeneity and the process control. Moreover, the form of the crucible and, subsequently, also the form of the molecular beam is restricted.

From EP 0 561 016 A1 it is known to manufacture organic layers from waxes or urethanes for example by first impregnating a porous carrier with a melt or with a solution of an organic material and then heating up the carrier in a thermal evaporator in order to evaporate the organic material. As the accommodating capacity of the carrier is known, this technique enables a quantitative evaporation of predetermined material quantities. The use of the carriers, however, has a series of disadvantages, so that this conventional technique only has limited suitability for the fulfillment of the above-mentioned requirements. There is a first disadvantage in the indirect heating of the impregnated carriers in an evaporator crucible. The heat input from an external source is inhomogeneous so that there is subsequently a non-uniform evaporation and, therefore, a non-uniform coating. In order to counteract this problem, with the conventional technique porous particles or thin platelets are used as carriers. The particles have the above-mentioned disadvantage of a worsened heat transition. The platelet shape represents an undesirable restriction of the evaporation-capable material volume and/or the evaporator geometry. There is a further disadvantage in the fact that, with the conventional carriers which are designed for a loading with an impregnation, a complete elimination of any possibly existing solvents cannot be ascertained. With numerous applications, the presence of solvents during the evaporation process is however problematic because the solvents as contaminating substances disturb the layer formation and the layer properties. During the manufacture of, in particular, organic, opto-electronic structural elements, this can lead to a reduction of the efficiency or the life service duration.

SUMMARY

According to a first aspect of the invention, a heating device for heating up material to be evaporated is transferred into the gas phase, wherein the heating device has a heating unit with an internal volume that is designed to hold the coating material and which contains a plurality of heating elements in a distributed arrangement. Contrary to the conventional evaporating techniques, a close and direct contact is ensured between the coating material and the heating unit and, with this, an immediate energy transfer into the coating material. As a result of the distribution of the heating elements in the volume of the heating unit, the effective contact surface between the coating material and the heating elements is substantially enlarged. The energy transfer is achieved simultaneously in all parts of the material volume to be evaporated so that a predetermined, e.g. uniformly shaped distribution of the material emerging in the gas or vapor phase is advantageously provided. A significant advantage of the heating unit therefore exists in the temperature homogeneity within its volume. With the distribution of the heating elements local overheated points ("hotspots") are avoided, thereby reducing the danger of a local decomposition of the coating material as a result of excessive heat input. With the heating device, according to an aspect of the invention, the coating material is directly and advantageously heated up, so that an excessive thermal stressing of the coating material can be avoided, the required evaporation temperatures for obtaining pre-specified coating rates can be reduced and an efficient evaporation can be generally achieved.

BRIEF DESCRIPTION OF THE DRAWINGS

For the purpose of illustrating the invention, the drawings show forms of the invention that are presently preferred. However, it should be understood that the invention is not limited to the precise argument and instrumentalities shown in the drawings.

DETAILED DESCRIPTION

Figure 3:
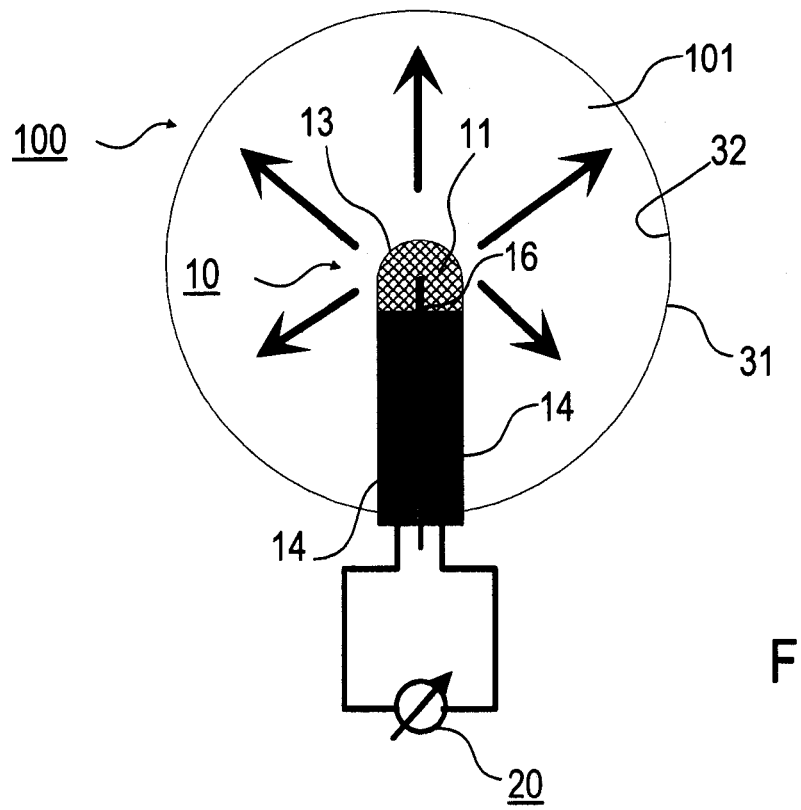
FIG. 3 is a schematic cross-sectional view of an embodiment of a heating device according to a preferred embodiment.

Embodiments of the invention are described as follows with exemplary reference to the use of heating units with a plane or convex outlet surface. It is emphasized that the invention with altered forms of the outlet surface and/or the mutual arrangement of the heating device relative to a substrate to be coated can be implemented in practice. Features of coating installations or evaporators and their operation, insofar as these are known from conventional evaporating techniques or can be adapted by the skilled person to the usage of the heating device according to the invention, are not explained with particular details in the following description. For example, with all embodiments a temperature sensor can be provided as shown in FIG. 3.

An aspect of the invention is to provide an improved evaporation or sublimation technique, in particular for coating installations, with which the disadvantages of the conventional evaporating techniques are overcome and which have an extended application range, particularly for the manufacture of layers with organic materials. With the evaporation technique, particularly a high coating performance (high material discharge per time unit), a homogeneous layer formation also with expanded substrates and/or a gentle and precise temperature setting during the heating of the material to be evaporated are to be achieved.

This aspect is solved by a heating device, a coating installation and a coating method with the features of the claims 1, 15 or 18. Advantageous embodiments and applications are described in more detail below.

The inner structure of the heating unit provides for a homogeneous material flow on the surface of the heating unit because of constant adsorption and desorption of the materials to be evaporated in the volume, and subsequently for a uniform coating. With this it is furthermore ensured that the evaporation characteristic also remains constant at various filling levels of the heating device, or changes only to a negligibly small degree.

With the use of the heating device according to embodiments of the invention there are advantageously no limitations with regard to the type of coating material to be evaporated which, depending on the specific use and originating from a liquid or solid condition, is to be transformed into the gas phase atomically, molecularly or in the aggregate state. The transfer into the gas phase comprises typically an evaporation or sublimation, wherein here the term "evaporation" is used for all types of the phase transition.

The term "heating element" as used herein comprises here each and every component envisaged in the heating unit which is suitable for the direct heating of adjacently arranged coating material. With a heating element the temperature of the adjacent coating material can be immediately and adjustably set according to the operational setting of a heat source. For this purpose, the heating elements represent as such the heat source or parts of the heat source.

If, according to a preferred embodiment of the invention, the heating elements are firmly embedded in the heating unit, a predetermined distribution of the heating elements can be advantageously realized. For example, the heating elements can be uniformly distributed for a homogenous radiation characteristic in the volume of the heating unit. Depending on the specific use, a non-uniform distribution of the heating elements can be envisaged as an alternative in order to obtain various evaporating rates in the various partial sections of the heating unit.

Generally, and according to aspects of the invention, the heating elements can be fixed-positioned as separate structural component in the heating unit. However, a variant is preferred where the heating elements and the heating unit are formed from a common material. The inner walls of the heating unit are used as heating elements. This embodiment of the invention has the advantage that the heating elements simultaneously serve as a carrier for the coating material. Advantageously, the heat transition is improved and additional carrier materials are avoided which could worsen the response reaction for the temperature setting with the heating device according to an embodiment of the invention.

Preferably, the heating elements consist of a material or of a material composition with a thermal conductivity of at least 2 W/m K. Advantageously, a quick temperature setting is achieved in the entire volume of the heating unit in this way. Heating elements with a thermal conductivity above 10 W/m K are particularly preferred.

to one advantageous variant of the invention, the heating elements are designed for the active heating of the coating material. In this case the heating elements are directly provided with an electric current for the purpose of immediately transforming electric energy into thermal energy. This embodiment of the invention has particular advantages with reference to a quick response reaction of the heating device. The heating elements can be, for example, directly connected to at least one power source. As an alternative, actively working heating elements can be induction elements in which a current flow is induced by means of an external electromagnetic effect.

According to a second variant the heating elements are designed for a passive heating of the coating material and, for this purpose, are connected directly to at least one heat source. This embodiment advantageously enables a simplified configuration of the heating device and a more flexible adaptation to specific evaporation tasks. With the provision of passive heating elements, and for the purpose of achieving a quick response reaction, an increased thermal conductivity of the heating elements above 50 W/m K is preferred.

Generally, the heating unit used according to embodiments of the invention has a three-dimensional inner structure through which hollow spaces and an inner surface are formed. Advantageously, there are no limitations with reference to the form of the inner structure. The structure can be selected in particular depending on the phase response (liquid, solid) of the coating material, on the evaporating material volume and/or the desired shape of the heating unit. Particularly preferred are heating units where the inner hollow spaces are formed by pores, lamellas (parallel partitions, with ligaments as required), honeycombs, open-pore foam and/or a compound of fibers.

The heating unit preferably consists of at least one electrically conductive material such as, for example, at least one metal and/or at least one ceramic material. These materials have advantages with reference to the mechanical and thermal stability and the processing capability for providing certain outer forms of the heating unit. The metallic materials that can be used include, for example, tungsten, tantalum, molybdenum, copper, gold, silver or high-grade steel (e.g. high-grade steel foam). Preferred ceramics include silicon carbide, boron nitride, aluminum oxide, boron nitrite-titanium diborite and aluminum nitrite or compounds of these. With a heating unit made from a metal-ceramic-compound, for example, a configuration with a metal-coated ceramic can be provided. Furthermore, the heating unit can contain graphite or can be fully made from graphite. In the first case, for example, a compound can be provided with a ceramic coated with graphite or with a ceramic in which graphite is embedded.

According to a further advantageous embodiment of the invention, the heating device comprises several heating units which can be loaded with one coating material or various types of coating materials. Depending on the specific coating task, for example, heater units which are loaded with various types of coating materials and/or have various inner structures can be arranged next to one another in an evaporating apparatus. It can be furthermore advantageous if several heating units are arranged over each other, e.g., in the form of a stack. Advantageously, the control of the evaporating process can be improved if the heating elements belonging to at least one of the heating units are operated separately from the other heating elements.

A further significant advantage of the heating device according to the invention is obtained if this is equipped with a guiding apparatus for the forming of a beam characteristic of the evaporated coating material. In contrast with the conventional crucible evaporation where the beam characteristic is determined by the crucible form, the temperature distribution in the crucible and the response of the coating material, a defined beam characteristic can be stipulated with the heating unit used according to embodiments of the invention. The guiding apparatus can be generally formed by every component that is suitable for giving the evaporated material a certain direction of movement. The guiding apparatus can be formed, for example, by a heating unit with heating elements, which heating unit during the operation of the heating device is not loaded with coating material but instead allows the coating material to pass through only.

The guiding apparatus has the particular advantage in that the transfer of the coating material into the gas phase is separated from the outlet of the evaporated coating material into the inner space of a coating installation. The guiding apparatus acts as a material transport medium. The transport of the evaporated material through the guiding apparatus is enabled by the constant adsorption and desorption of the coating material in the inner structure of the guiding apparatus. Advantageously, the heating unit provided for the evaporation can be subsequently optimized with reference to the function of the transfer of the coating material into the gas phase, while the additional body of the guiding apparatus is optimized for the control of the material flow.

The heating unit and/or the guiding apparatus are advantageously freely selectable in their outer form according to the desired evaporation characteristic. The surface through which the evaporated material exits and which lies free towards a substrate (outlet surface), is freely selectable depending on the specific evaporating task. In this way, not only plane surfaces can be homogeneously coated but also manifold curved, concave or convex surfaces. A curved outlet surface can be formed differently in partial areas, particularly concave or convex. There is a further advantage in the fact that the evaporating characteristic is influenced by the form-shaping in such a way that the material flow during the evaporating process is directed primarily in the direction of the object to be evaporated. The efficiency of the evaporation is therefore increased which is determined by the relationship between the material volume on the object to be coated and the material to be applied in the evaporating system. The form of the outlet surface is preferably selected depending on the form of the surface of the substrate to be coated.

Advantageously, the inner structure of the heating unit can be freely dimensioned depending on the conditions of a specific evaporating task. The size of the hollow spaces, e.g., of the pores can be selected depending on the phase response of the coating material and the desired discharge volume. For solid coating materials, e.g. materials in powder or in particle form, it is advantageous with regard to the loading of the heating unit and for large discharge volumes to select the hollow spaces with a characteristic size in the range of 1 mm to 5 cm. This characteristic size refers to at least one space direction, as e.g. the distance between neighboring parallel lamellas with a lamella structure or the distance between opposite inner walls with a honeycomb structure. For certain uses, it can be advantageous to select the intermediate spaces in the inner structure smaller. For example, for the evaporation of materials which have the liquid phase during loading, the inner structure is dimensioned in such a way that capillary forces lead to homogeneous introduction and distribution of the material in the heating unit and, thus, to a uniform evaporation. Accordingly, it can be advantageous if the hollow spaces of the heating unit have, in at least one space direction, a characteristic size in the range of 1 µm to 1 mm.

The suitable dimensioning of the inner structure can be selected by those skilled in the art depending on the evaporating conditions. In this way, a characteristic size of e.g. 3 cm can be suitable for the evaporation of large-surface substrates (with dimensions in the dm range to the m range).

According to a second aspect of the invention, the abovementioned object is solved by a coating installation which is equipped with at least one heating device according to the invention.

According to a preferred embodiment of the invention, the coating installation furthermore has a substrate holder with which a substrate to be coated is positionable so that its surface runs along a predetermined reference surface. Preferably, the reference surface and the outlet surface of the heating device are formed with geometrical similarity.

According to a third aspect of the invention, the abovementioned object is solved by an evaporating method wherein at least one heating unit according to the invention is loaded with the material to be evaporated and the heating elements of the at least one heating unit are put into operation for the direct heating of the material to be evaporated.

Advantageously, the method according to the invention is characterized by a short reaction time during the temperature setting in the material to be evaporated. The temperature in the heating device can be set with a greater degree of accuracy so that a protective evaporation at high evaporating rates is enabled.

According to preferred embodiments of the invention, the heating elements of the at least one heating unit are, directly or inductively, provided with an electric current or, alternatively, a thermal current.

A further independent subject-matter of the invention is the use of a heating device according to the invention or a coating installation according to the invention for the manufacture of layers from organic materials, particularly from organic dyes.

Figure 1:
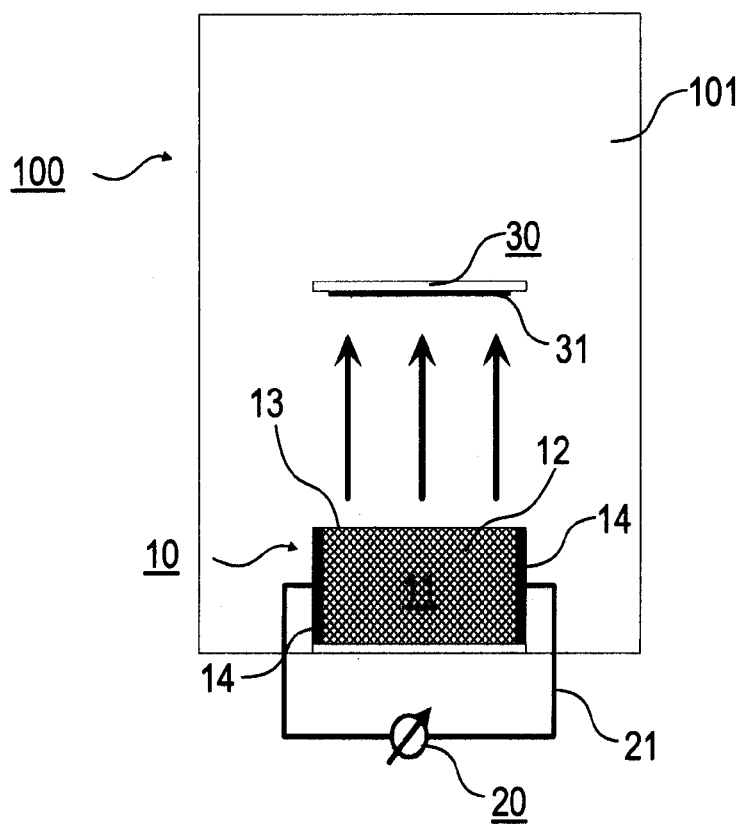
FIG. 1 is a schematic cross-sectional view of an embodiment of a heating device according to a preferred embodiment.

FIG. 1 illustrates in a schematic cross-sectional view a coating installation 100 according to an embodiment of the invention with a heating device 10, an external power source 20 and a substrate holder 30. The inner space of the heating device 100 is a deposition chamber 101 that is known as such which is evacuated with a vacuum apparatus (not shown) or which is filled with an inert gas source (not shown) with a carrier gas.

The heating device 10 comprises a heating unit 11 made from a solid material with open pores. The heating unit 11 consists of silicon carbide with an average pore size of approximately 1 mm. This pore size is suitable, for example, for the evaporation of organic dyes such as, for example, phthalocyanines or similar coating materials. The schematically illustrated material of the heating unit 11 forms the heating elements 12 between which the coating material to be evaporated can be arranged. The heating unit 11 has a plane outlet surface 13 whose form is selected according to the plane form of a substrate 31 on the substrate holder 30.

The heating unit 11 has lateral contact surfaces 14 which are connected to the power source 20 by way of electric conductors 21. The power source 20 comprises, for example, a D.C. power source with which and with an operating voltage of, for example, 20 V, a heating current of 2 A can be conducted through the heating unit 11.

The heating unit 11 has the form of a cuboid with a height of, for example, 1 cm and side lengths of, for example, 5 cm. The distance of the outlet surface 13 from the substrate 31 is, for example, 5 cm.

The coating of the substrate 31 comprises the following process steps. First, the heating unit 11 is loaded with the coating material to be evaporated. For this purpose, the coating body 11 is provided at a loading station (not shown). The coating material to be evaporated is deposited onto the surface of the heating unit 11, e.g. onto the outlet surface 13. Depending on the pore size, the coating material trickles into the volume of the heating unit 11. The trickling can be supported by a vibration of the heating unit 11. Solid coating materials can be put, as an alternative, as liquid dispersion into the heating unit 11 by means of dropping in or pouring over. With the evaporation of liquid coating materials, the heating unit 11 is submerged at the loading station into the liquid phase of the coating material and/or poured over with this, so that the coating material is suctioned into the heating unit 11. As an alternative, the heating unit 11 can be loaded in the deposition chamber 101.

After this, the power source 20 is activated. With the application of electric current, the heating unit 11 acts as a resistance heater through which the temperature of the coating material is increased up to the point of evaporation. The temperature can be detected with a temperature sensor (see FIG. 3) or, if there is a defined relationship between the temperature and the electric resistance of the heating unit 11, by a resistance measurement and, as required, set with a control loop to the desired value. The high thermal conductivity of the heating unit 11 and its inner branched structure ensure a homogeneous temperature distribution in the heating unit. The direct heat generation at the location of the coating material enables an immediate and inertia-free intervention in the evaporation process. The heated coating material goes over into the gaseous phase in the heating unit. With multiple adsorption and desorption, the coating material makes its way through the outlet surface 13 to the outside where the further material flow (arrows) leads to the substrate 31. The set temperature lies, for example, in the range of between 50° C. and 600° or above this range.

Deviating from the cuboid-shaped geometry for an areal evaporator, the principle illustrated in FIG. 1 can be realized with a linear-shaped outlet surface (linear or slot type evaporator) or a practically point-shaped outlet surface (quasi-point evaporator).

Figure 2:
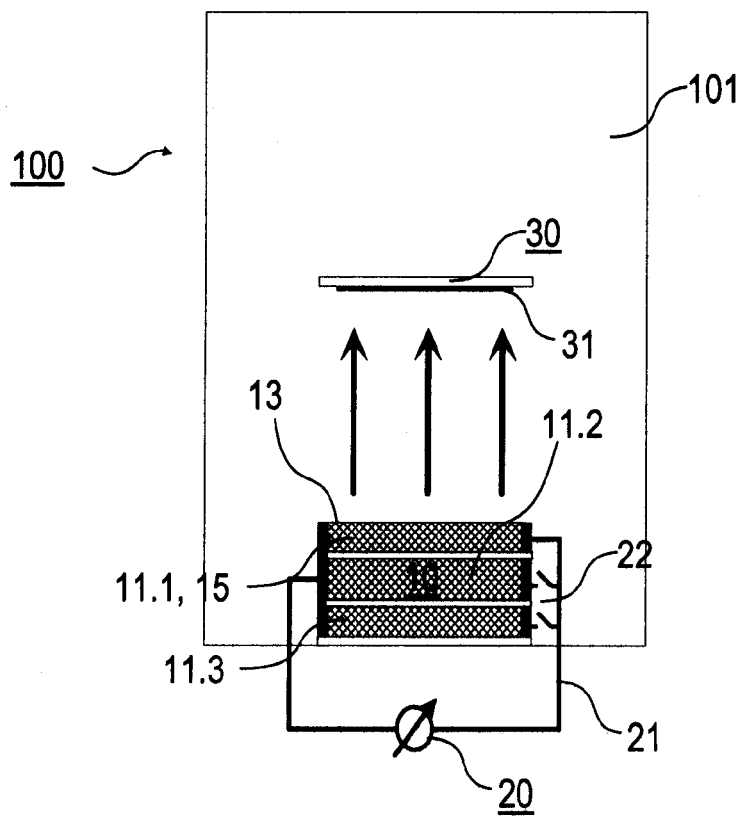
FIG. 2 is a schematic cross-sectional view of an embodiment of a heating device according to a preferred embodiment.

FIG. 2 illustrates in a schematic cross-sectional view a coating installation 100 where, deviating from the layout according to FIG. 1, several heating units 11.1, 11.2, 11.3 are provided. With a switching device 22, the individual heating units 11.1, 11.2, 11.3 can be switched in the evaporation process according to a determined operating scheme, in a sequential mode for example. This mode of operation has the advantage that the heating units can be loaded with a large volume of evaporating material which can be incrementally released by switching on the heating units. If the uppermost heating unit 11.1 has been unloaded by the evaporation, it forms for the further evaporation a guiding apparatus 15 for aligning the material flow along the route to the substrate 31.

FIG. 3 schematically illustrates according to the invention the coating of concave surfaces. With the illustration as shown, the substrate 31 is a hollow sphere whose inner surface 32 is to be homogeneously coated. The inner space of the hollow sphere forms the deposition chamber 101 which can be evacuated or filled with an inert gas.

The heating unit 11 of the heating device 10 consists of an open-pore, foamed and electrically conductive ceramic, e.g., silicon carbide which is inert opposite the coating materials to be coated. The outlet surface 13 of the heating unit 11 is formed convex as the surface of a semi-sphere or as the surface of a combination of a semi-sphere and a circular cylinder.

On the underneath side of the heating unit 11, two contact zones 14 that are electrically isolated from one another are arranged which serve the purpose of providing the heating unit 11 with electric current and, at the same time, support the mechanical holding of the heating unit 11 in the middle of the hollow sphere. Furthermore, a temperature sensor 16 is provided with which the setting of the temperature in the heating unit 11 is monitored and which can be used for controlling the evaporating process. The contact zones 14 are connected to the power source 20 by way of a switching device (not shown).

The evaporating process is carried out analogously to the process steps as described above. Following the loading of the heating unit 11, the resistance heating and the temperature setting is performed in such a way that the coating material is moved on all sides from the outlet surface 13 (see arrows) to the inner surface 32 of the substrate 31. A homogeneous material flow is ensured in all directions as a result of the inner structure of the heating unit 11. If an inert gas pressure is set in the hollow sphere, the homogeneity of the coating on the surface 32 can be increased by the scattering of the evaporated material on the gas molecules.

Figure 4:
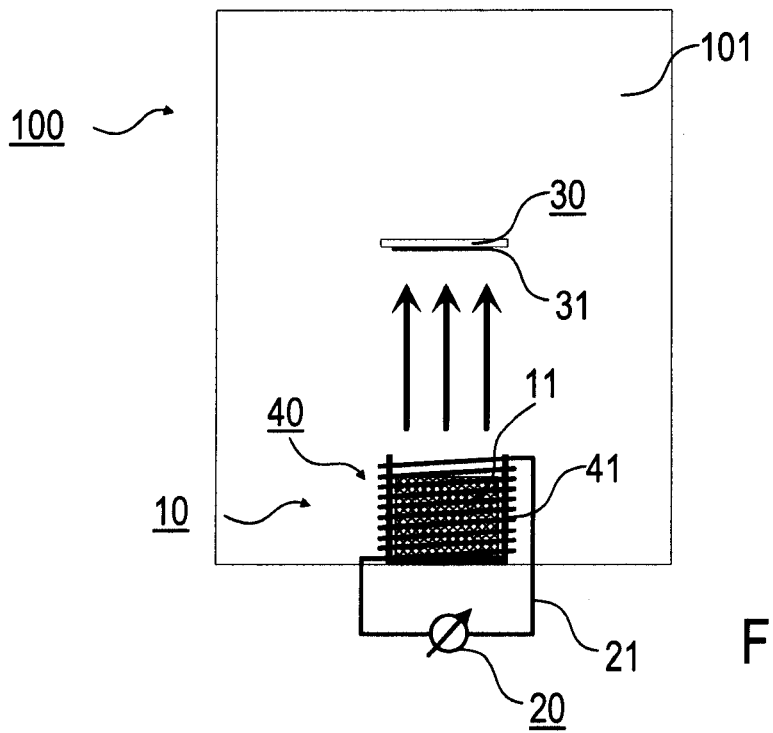
FIG. 4 is a schematic cross-sectional view of an embodiment of a heating device according to a preferred embodiment.

FIG. 4 illustrates a further embodiment of the invention with indirectly heated heating elements. The heating device 10 with the heating unit 11 is arranged in the deposition chamber 101 of the coating installation 100. The heating unit 11 is thermally connected to a heat source 40 in the form of a spiral-shaped circulating filament 41 that can be supplied with electric current by way of electric conductors 21 to a power source 20. In the deposition chamber 101, furthermore, the substrate holder 30 is provided for a substrate 31 to be coated. As different to the embodiment of the invention described above, the heating unit 11 in the variant shown in FIG. 4 is supplied with a heat current which serves the purpose of setting the evaporating temperature of the coating material in the heating unit 11. The evaporation takes place in accordance with the process steps as described above.

The features of the various embodiments of the invention as disclosed in this description, in the claims and in the drawings can be of significance both individually as well as in random combination for the realization of the invention in its various embodiments.

It is to be understood that the embodiments described above and shown in the drawings are only to be regarded as non-limiting examples of the present invention, and are susceptible to various modifications and alternatives within the spirit and scope of the patent claims and any and all equivalents thereto.

The invention claimed is:

1. A heating device adapted for use in a coating installation, wherein a liquid or a solid coating material can be transferred into a gas phase, comprising:
at least one heating unit comprising:
a solid material formed by an open-pore foam opening towards the outlet surface, the solid material comprising hollow spaces sized to accept a coating material, thereby providing a carrier, which can be loaded with the liquid or solid material,
a plurality of heating elements which are located in a distributed arrangement in the volume of the heating unit for direct resistance heating,
an outlet surface exposed towards a substrate, wherein the outlet surface is a curved convex surface, and
an outlet for coating material transferred into the gas phase.

2. The heating device according to claim 1, wherein the heating elements are embedded in the solid material of the heating unit.

3. The heating device according to claim 1, wherein the heating unit further comprises inner walls that form the heating elements.

4. The heating device according to claim 1, wherein the heating elements have a thermal conductivity of 2 W/m K.

5. The heating device according to claim 1, wherein the heating elements further comprise an electric current for the immediate conversion of electric energy into thermal energy.

6. The heating device according to claim 1, wherein the heating elements are directly connected to at least one thermal source.

7. The heating device according to claim 1, wherein the heating unit is formed from at least one of the group consisting of a metal, a ceramic material or a metal-ceramic compound.

8. The heating device according to claim 1, having several heating units provided with heating elements, which heating units are sized to allow entry of the coating material.

9. The heating device according to claim 8, wherein the heating elements of afleast one of the heating units can be separately operated from the heating ele-ments of the other heating units.

10. The heating device according to claim 1, further comprising a guiding apparatus for the formation of abeam characteristic of the coating material.

11. The heating device according to claim 1, wherein the outlet surface of at least one of the heating units forms a guiding apparatus, enabling the formation of a beam characteristic of the coating material transferred into the gas phase.

12. The heating device according to claim 1, wherein the hollow spaces in at least one dimension have a length in the range of about 1 mm to 5 cm.

13. The heating device according to claim 1, wherein the hollow spaces in at least one dimension have a length in the range of about 1 µm to 1 mm.

14. The heating device according to claim 1, wherein the heating device forms a portion of a coating installation.

15. The heating device according to claim 14, further comprising a substrate holder for positioning a substrate to be coated along a predetermined reference surface.

16. The heating device according to claim 15, wherein the heating device comprises a predetermined outlet surface or a guiding apparatus for the formation of a beam characteristic of the coating material transferred into the gas phase, wherein the outlet surface extends along the reference surface of the substrate holder.

17. The heating device according to claim 10, wherein the guiding apparatus is formed with inner hollow spaces comprising at least one of pores, lamellas, honeycombs, open-pore foam and a compound of fibers.

18. A heating device adapted for use in a coating installation, wherein a liquid or a solid coating material can be transferred into a gas phase, comprising:
at least one heating unit comprising:
a solid material formed by an open-pore foam opening towards the outlet sur-face, the solid material comprising hollow spaces sized to accept a coating material, thereby providing a carrier, which can be loaded with the liquid or solid material,
a plurality of heating elements which are located in a distributed arrangement in the, volume of the heating unit for direct resistance heating,
an outlet surface exposed towards a substrate, wherein the outlet surface is a curved convex surface, and wherein the substrate is a hollow sphere, and
an outlet for coating material transferred into the gas phase, wherein the inner surface of the hollow sphere is coated with the material transferred into the gas phase.

19. The heating device according to claim 18, wherein the outlet surface comprises a surface of a semi-sphere or a combination of a semi-sphere and a circular cylinder.

20. The heating device according to claim 18, further comprising two electrically isolated contact zones for providing the heating unit with electric current and for supporting the heating unit in the hollow sphere.

21. The heating device according to claim 18, further comprising a temperature sensor for monitoring a setting of the temperature in the heating unit.

* * * * *